United States Patent
Lee et al.

(12) United States Patent
(10) Patent No.: US 8,320,416 B2
(45) Date of Patent: Nov. 27, 2012

(54) LASER IRRADIATION SYSTEM

(75) Inventors: Kyong-Taeg Lee, Yongin (KR);
Hyun-Cheul Shin, Yongin (KR);
Won-Woong Jung, Yongin (KR);
Tae-Wook Kang, Yongin (KR)

(73) Assignee: Samsung Display Co., Ltd., Yongin, Gyunggi-Do (KR)

( * ) Notice: Subject to any disclaimer, the term of this patent is extended or adjusted under 35 U.S.C. 154(b) by 0 days.

(21) Appl. No.: 12/801,329

(22) Filed: Jun. 3, 2010

(65) Prior Publication Data

US 2011/0080926 A1    Apr. 7, 2011

(30) Foreign Application Priority Data

Oct. 5, 2009    (KR) .................. 10-2009-0094382

(51) Int. Cl.
*H01S 3/10*    (2006.01)

(52) U.S. Cl. ........................................... 372/9

(58) Field of Classification Search .................. 372/9
See application file for complete search history.

(56) References Cited

U.S. PATENT DOCUMENTS

| | | | | |
|---|---|---|---|---|
| 5,136,480 | A | * | 8/1992 | Pristash et al. ................ 362/618 |
| 2007/0160280 | A1 | * | 7/2007 | Schutze et al. ................ 382/133 |
| 2008/0159349 | A1 | * | 7/2008 | Kaji et al. .................. 372/38.02 |

FOREIGN PATENT DOCUMENTS

| | | |
|---|---|---|
| CN | 101298115 A | 11/2008 |
| JP | 63-160776 A | 7/1988 |
| JP | 2005-001216 A | 1/2005 |
| KR | 10 2007-0078501 A | 8/2007 |
| KR | 10-0759098 B1 | 9/2007 |
| KR | 10 2008-0041558 A | 5/2008 |
| KR | 10 2009-0027456 A | 3/2009 |

* cited by examiner

*Primary Examiner* — Patrick Stafford
(74) *Attorney, Agent, or Firm* — Lee & Morse, P.C.

(57)    ABSTRACT

A laser irradiation system includes a laser configured to irradiate light, a laser transfer unit configured to transfer the laser along a target irradiation area, the target irradiation area being divided into a plurality of sections, a laser transfer controller configured to control a speed of the laser in each of the plurality of sections of the target irradiation area, a laser output controller configured to control an output level of the laser in each of the plurality of sections of the target irradiation area, and a main controller configured to control the laser output controller and the laser transfer controller.

20 Claims, 4 Drawing Sheets

LASER IRRADIATION SYSTEM

BACKGROUND

1. Field

The described technology relates to a laser irradiation system. More particularly, the described technology relates to a laser irradiation system that is used to manufacture a display panel.

2. Description of the Related Art

In general, a laser irradiation system may be used for various purposes in the manufacture of display panels. For example, the laser irradiation system may be used in the process of bonding and sealing a plurality of substrates.

For example, a display panel may include a pair of substrates bonded and sealed together with a sealant. The laser irradiation system may be used to harden the sealant by irradiating light onto the sealant between the pair of substrates.

The above information disclosed in this Background section is only for enhancement of understanding of the background of the described technology and therefore it may contain information that does not form the prior art that is already known in this country to a person of ordinary skill in the art.

SUMMARY

Embodiments are therefore directed to a laser irradiation system, which substantially overcomes one or more of the problems due to the limitations and disadvantages of the related art.

It is therefore a feature of an embodiment to provide a laser irradiation system capable of adjusting a laser output in real time according to regions of a target area.

It is another feature of an embodiment to provide a laser irradiation system capable of adjusting a laser speed in real time according to regions of a target area.

It is yet another feature of an embodiment to provide a method of irradiating light with a laser irradiation system including one or more of the above features.

At least one of the above and other features and advantages may be realized by providing a laser irradiation system, including a laser for irradiating light, a laser transfer unit for transferring the laser along a target irradiation area divided into a plurality of sections, a laser transfer controller for controlling the laser transfer unit such that the laser is transferred at a preset speed for each of the plurality of sections, a laser output controller for controlling the output of the laser such that the laser irradiates light at a preset output for each of the plurality of sections, and a main controller for controlling the laser output controller and the laser transfer controller.

The laser output controller may adjust the output of the laser according to the operating state of the laser transfer unit detected in real time by the laser transfer controller.

The plurality of sections may include a linear section and a curved section.

The laser transfer unit may transfer the laser such that, in the curved section, the center of the light irradiated by the laser may be closer to the outer periphery of the target irradiation area than to the inner periphery thereof.

The laser transfer controller may control the laser transfer unit such that the laser is transferred at a relatively lower speed in the curved section than in the linear section.

When the laser transfer controller detects that the laser transfer unit is in an operating state for transferring the laser along the curved section, the laser output controller may relatively reduce the output of the laser.

The plurality of sections may include a high conductivity section and a low conductivity section.

The laser transfer controller may control the laser transfer unit such that the laser is transferred at a relatively higher speed in the high conductivity section than in the low conductivity section.

When the laser transfer controller detects that the laser transfer unit is in an operating state for transferring the laser along the high conductivity section, the laser output controller may relatively reduce the output of the laser.

In the above laser irradiation system, the laser may irradiate light along a closed loop in which a light irradiation start point and a light irradiation end point are the same, and as the laser moves farther away from the light irradiation start point, the laser output controller may gradually increase the output of the laser to a preset output level, while as the laser moves closer to the light irradiation end point, the laser output controller may gradually decrease the output of the laser from the preset output level.

The laser transfer controller may be configured to modify the speed of the laser between at least two different speed values according to a type of section of the plurality of sections in the target irradiation area that is being irradiated.

The laser output controller may be configured to modify the output level of the laser between at least two different output values according to a type of section of the plurality of sections in the target irradiation area that is being irradiated.

Operations of the laser transfer controller and laser output controller may be performed in real time and may be simultaneous with respect to predetermined sections of the target irradiation area.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
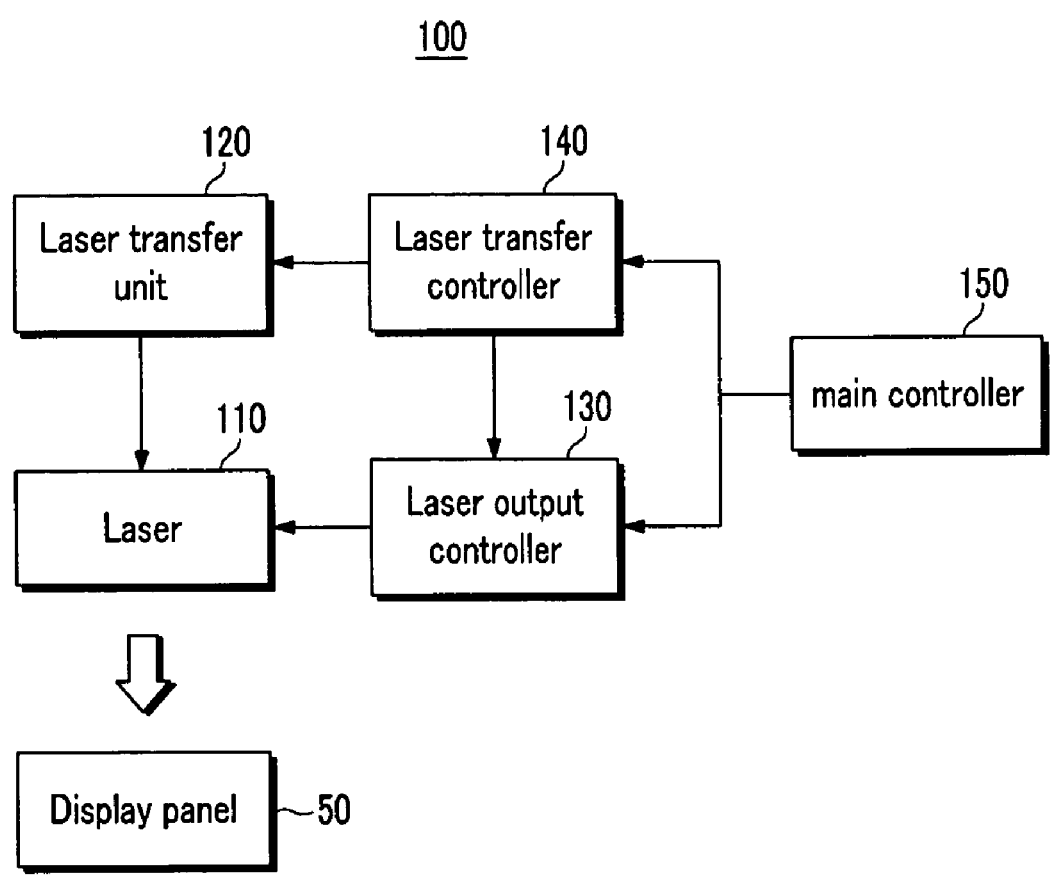
FIG. 1 illustrates a block diagram of a laser irradiation system in accordance with a first exemplary embodiment.

Korean Patent Application No. 10-2009-0094382, filed on Oct. 5, 2009, in the Korean Intellectual Property Office, and entitled: "Laser Irradiation System," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

A laser irradiation system 100 in accordance with a first exemplary embodiment will be described with reference to FIGS. 1 and 2. The use of the laser irradiation system 100 for hardening a sealant 55 in the manufacture of a display panel 50 will be described in detail by way of example.

As illustrated in FIG. 1, the laser irradiation system 100 may include a laser 110, a laser transfer unit 120, a laser transfer controller 140, a laser output controller 130, and a main controller 150. The laser 110 may irradiate light adjusted by the laser transfer unit 120 and laser output controller 130.

As illustrated in FIG. 1, the laser 110 may emit light toward the display panel 50. The light emitted from the laser 110 hardens the sealant 55 (FIG. 2) of the display panel 50 (FIG. 2). As illustrated in FIG. 2, the display panel 50 may include a pair of substrates 51 and 52, e.g., parallel to each other, and the sealant 55 may be disposed between the pair of substrates 51 and 52 to bond them to each other. For example, the sealant 55 may be on peripheries of the pair of substrates 51 and 52 to bond and seal them together.

The laser transfer unit 120 may transfer the laser 110, e.g., direct the laser 110 along a predetermined direction to be incident on a predetermined area of a target surface. For example, the laser transfer unit 120 may transfer the laser 110 along a target irradiation area IA including a plurality of sections. Since the laser irradiation system 100 hardens the sealant 55 of the display panel 50, the target irradiation area IA may include the sealant 55, e.g., the sealant 55 may be entirely within the target irradiation area IA. For example, if the sealant 55 is applied along the peripheries of the substrates 51 and 52, e.g., along an entire perimeter of the display panel 50 as illustrated in FIG. 2, the target irradiation area IA may include the peripheries of the substrates 51 and 52, e.g., the entire sealant 55 illustrated in FIG. 2.

Figure 2:
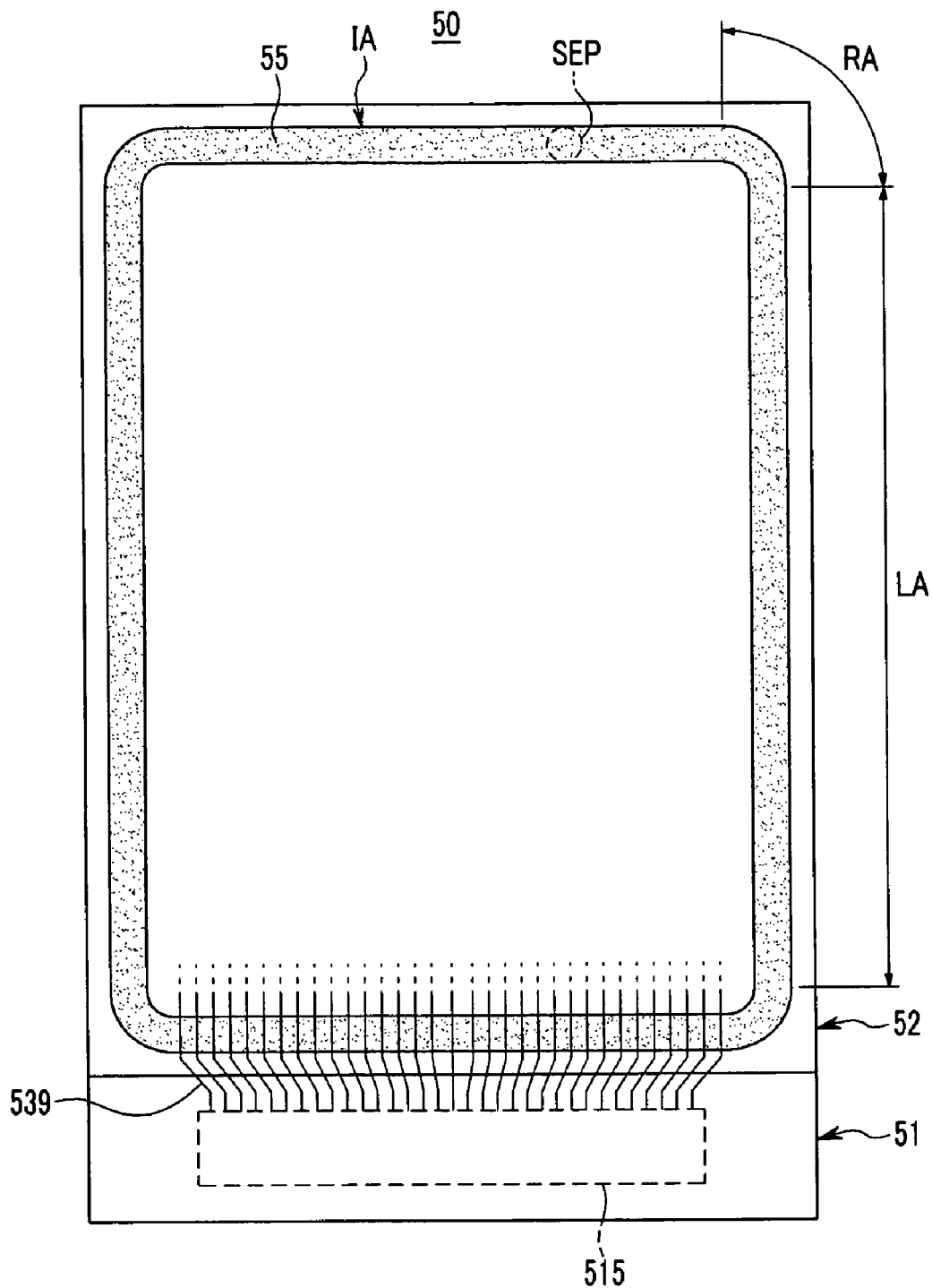
FIG. 2 illustrates a layout view of a display panel receiving light irradiated from the laser irradiation system of FIG. 1.

As illustrated in FIG. 2, the target irradiation area IA may be divided into a plurality of sections, e.g., a linear section LA and a curved section RA, corresponding to a shape of the sealant 55. For example, as further illustrated in FIG. 2, the target irradiation area IA may be an area overlapping the sealant 55, such that the target irradiation area IA may include four linear sections LA and four curved, e.g., rounded, sections RA arranged alternately into a loop-shape, e.g., the curved sections RA may correspond to rounded corners of a loop-shaped sealant 55.

Figure 3:
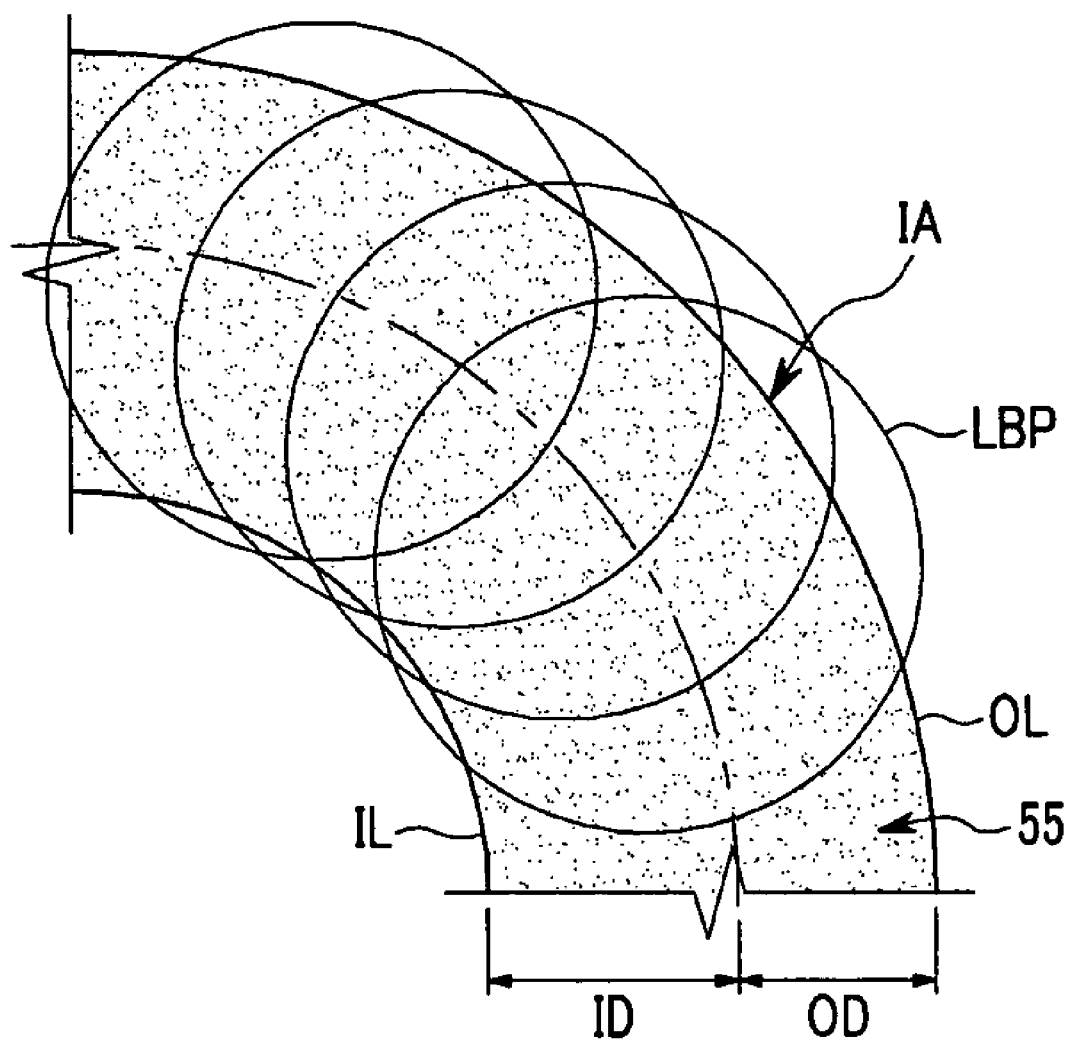
FIG. 3 illustrates a schematic, enlarged view of an irradiated portion of the display panel in FIG. 2.

In detail, referring to FIG. 3, the laser transfer unit 120 may transfer the laser 110 to irradiate light onto the sealant 55, e.g., translate light from the laser 110 along the sealant 55, such that a point of the irradiated light LBP on the target irradiation area IA may have a center closer to an outer periphery OL of the target irradiation area IA than to an inner periphery IL thereof in the curved section RA. In other words, referring to FIG. 3, the center of the light (indicated by a dashed line) may be adjusted, such that a distance OD between the center of the light and the outer periphery OL may be shorter than a distance ID between the center of the light and the inner periphery IL. Reference numeral LBP in FIG. 3 indicates one point of the light irradiated from the laser 110.

When the center of the light irradiated from the laser 110 in the curved section RA is moved along the center of the target irradiation area IA, e.g., when a distance OD equals a distance ID, the inner periphery IL may receive a larger amount of light, i.e., a higher amount of energy, than the outer periphery OL, since the radius of the inner periphery IL is smaller than the radius of the outer periphery OL. In other words, since a linear speed along a curve with a small radius, i.e., along the inner periphery IL, is lower than a linear speed along a curve with a large radius, i.e., along the outer periphery OL, an amount of energy irradiated on the curve with the small radius, i.e., the inner periphery IL, may be larger. As such, by moving the center of the light irradiated from the laser 110 closer to the outer periphery OL than to the inner periphery IL, e.g., when the distance OD is shorter than the distance ID as illustrated in FIG. 3, the outer periphery OL may be positioned closer to the center of the light. When the outer periphery OL is closer to the center of light, a larger amount of light may be applied to the outer periphery OL, and a difference in energy received by the inner periphery IL and the outer periphery OL may be minimized. When the difference in energy received by the inner and outer peripheries IL and OL is minimized, irradiation uniformity of the sealant 55 may be improved, thereby improving uniformity of degree of hardness throughout the sealant 55.

The laser transfer controller 140 may control the laser transfer unit 120, such that the laser 110 may be transferred at a predetermined speed for each of the plurality of linear and curved sections LA and RA, e.g., the laser transfer controller 140 may adjust speed corresponding to each of the linear and curved sections LA and RA via the laser transfer unit 120. Thus, the laser transfer controller 140 may adjust the speed at which the laser 110 is transferred in the linear section LA and the curved section RA of the target irradiation area IA. For example, the laser transfer controller 140 may control the laser transfer unit 120 to transfer, e.g., translate, the laser 110 at a lower speed in the curved section RA than in the linear section LA.

The laser output controller 130 may adjust the energy level of the light irradiated from the laser 110. The laser output controller 130 may control the laser 110 to irradiate light at a predetermined level for each of the plurality of linear and curved sections LA and RA. For example, the laser output controller 130 may adjust the output of the laser 110 according to the operating state of the laser transfer unit 120, e.g., with respect to position of light incidence on the target irradiation area IA, as detected in real time by the laser transfer controller 140. That is, the laser output controller 130 may adjust the output of the laser 110 to irradiate light at a predetermined level for each of the linear and curved sections LA and RA based on data detected in real time by the laser transfer controller 140 regarding in which section the laser transfer unit 120 is transferring the laser 110.

For example, when the laser transfer controller 140 detects that the laser transfer unit 120 is in an operating state for transferring the laser 110 along the curved section RA, the laser output controller 130 may reduce the output of the laser 110, e.g., relative to an output in the linear section LA. Then, when the laser transfer controller 140 detects that the laser transfer unit 120 is in an operating state for transferring the laser 110 along the linear section LA, the laser output controller 130 may increase the output of the laser 110. In other words, an energy level output from the laser 110 may be adjusted according to the irradiated section of the target irradiation area IA, so the curved section RA of the target irradiation area IA may be irradiated at a lower energy level.

The main controller 150 may adjust the set values of the laser transfer controller 140 and the laser output controller 130. For example, depending on the environment and requirements of the laser irradiation system 100, the main controller 150 may adjust the set values of the laser transfer controller 140 and the laser output controller 130 with respect to the speed, i.e., laser translation speed, and output value, i.e., energy level, for each section of the target irradiation area IA.

The laser irradiation system 100 according to embodiments may flexibly control the output and speed of light irradiated by the laser 110, thereby allowing a uniform amount of energy to be irradiated on each of the sections LA and RA of the target irradiation area IA. Particularly, the amount of energy received by the entire target irradiation area IA may be substantially uniform, i.e., in the linear section LA and curved section RA.

For example, the laser transfer unit 120 may adjust transfer of the laser 110 at a relatively lower speed in the curved section RA than in the linear section LA to increase translation precision of the laser 110 in the curved section RA. Further, the laser output controller 130 may, e.g., automatically, adjust the output of the laser 110 in the curved section RA to be lower than in the linear section LA. For example, the speed and output of the laser 110 may be adjusted substantially simultaneously by the laser transfer unit 120 and laser output controller 130, respectively, in response to, e.g., simultaneous, signals from the laser transfer controller 140. Therefore, a substantially uniform amount of energy may be irradiated on the entire target irradiation area IA, thereby facilitating substantially uniform hardening of the sealant 55, and consequently, stable bonding and sealing between the pair of substrates 51 and 52 of the display panel 50.

In contrast, when a conventional laser irradiation system irradiates light without considering an environment and state of the sealant, e.g., without considering a geometrical configuration of the sealant, the sealant may be hardened non-uniformly and may trigger defects in the display panel. For example, if an output of a laser in a conventional laser irradiation system is constant regardless of varying translation speeds, e.g., due to varying geometries, a final amount of energy of light irradiated on a target area may be non-uniform. In other words, if an output of a laser in a conventional laser irradiation system is constant in both curved and linear sections of a sealant, when a translation speed of the laser in the curved section is lower than in the linear section, an amount of energy irradiated in the curved section may be greater than in the linear section, thereby having different hardening degrees of sealant in the linear and curved section. As such, the sealant may not be stably hardened and may cause the sealing state of the display panel 50 to be defective.

Therefore, the laser irradiation system 100 in accordance with the first exemplary embodiment may provide for, e.g., simultaneous, adjustment of speed and output from the laser 110 with respect to a type, e.g., geometry, of a region of the target irradiation area IA in order to increase uniformity of an amount of energy throughout the sealant 55. Moreover, the laser irradiation system 100 may facilitate position adjustment of the light LBP irradiated from the laser 110, so the center of light LBP may be closer to the outer periphery OL of the target irradiation area than to the inner periphery IL thereof, thereby effectively minimizing differences in amounts of energy applied to the inner and outer peripheries IL and OL of the target irradiation area IA. Thus, the laser irradiation system 100 in accordance with the first exemplary embodiment may be able to stably and uniformly harden the sealant 55 of the display panel 50.

It is further noted, as illustrated in FIG. 2, that the laser 110 in the first exemplary embodiment may irradiate light along a closed loop in which a light irradiation start point and a light irradiation end point may be the same. That is, the target irradiation area IA may be formed as a closed loop. Hereafter, the light irradiation start point and the light irradiation end point are referred to as a light irradiation reference point SEP.

As the laser 110 moves farther away from the light irradiation reference point SEP, the laser output controller 130 may gradually increase the output of the laser 110 to a predetermined output level. As the laser 110 moves closer to the light irradiation reference point SEP, the laser output controller 130 may gradually decrease the output of the laser 110 from the predetermined output level. At this point, the movement of the laser 110, e.g., movement along the target irradiated area IA of a beam of light irradiated from the laser 110, may be detected in real time by the laser transfer controller 140 and may be transmitted to the laser output controller 130.

For example, a position of the irradiated light LBP on the target irradiated area IA relative to the light irradiation reference point SEP may be determined by the laser transfer controller 140, so the light irradiation reference point SEP may not be irradiated twice, e.g., when irradiation of a closed loop is complete. Thus, non-uniform hardening of the sealant 55 at the light irradiation reference point SEP with respect to other areas on the target irradiation area IA may be prevented or substantially minimized. As a result, uniformity of the amount of energy received by the entire target irradiation area IA may be increased. In another example, the position of the irradiated light LBP on the target irradiated area IA relative to the light irradiation reference point SEP may be determined by the laser transfer controller in order to detect whether the irradiated light LBP irradiates a linear section LA or a curved section RA.

According to another embodiment, the laser irradiation system 100 may be used in manufacturing of the display panel 50 by adjusting speed and level of the laser 110 according to a different division of the target irradiation area IA. A second exemplary embodiment will be described hereinafter with reference to FIG. 4.

Figure 4:
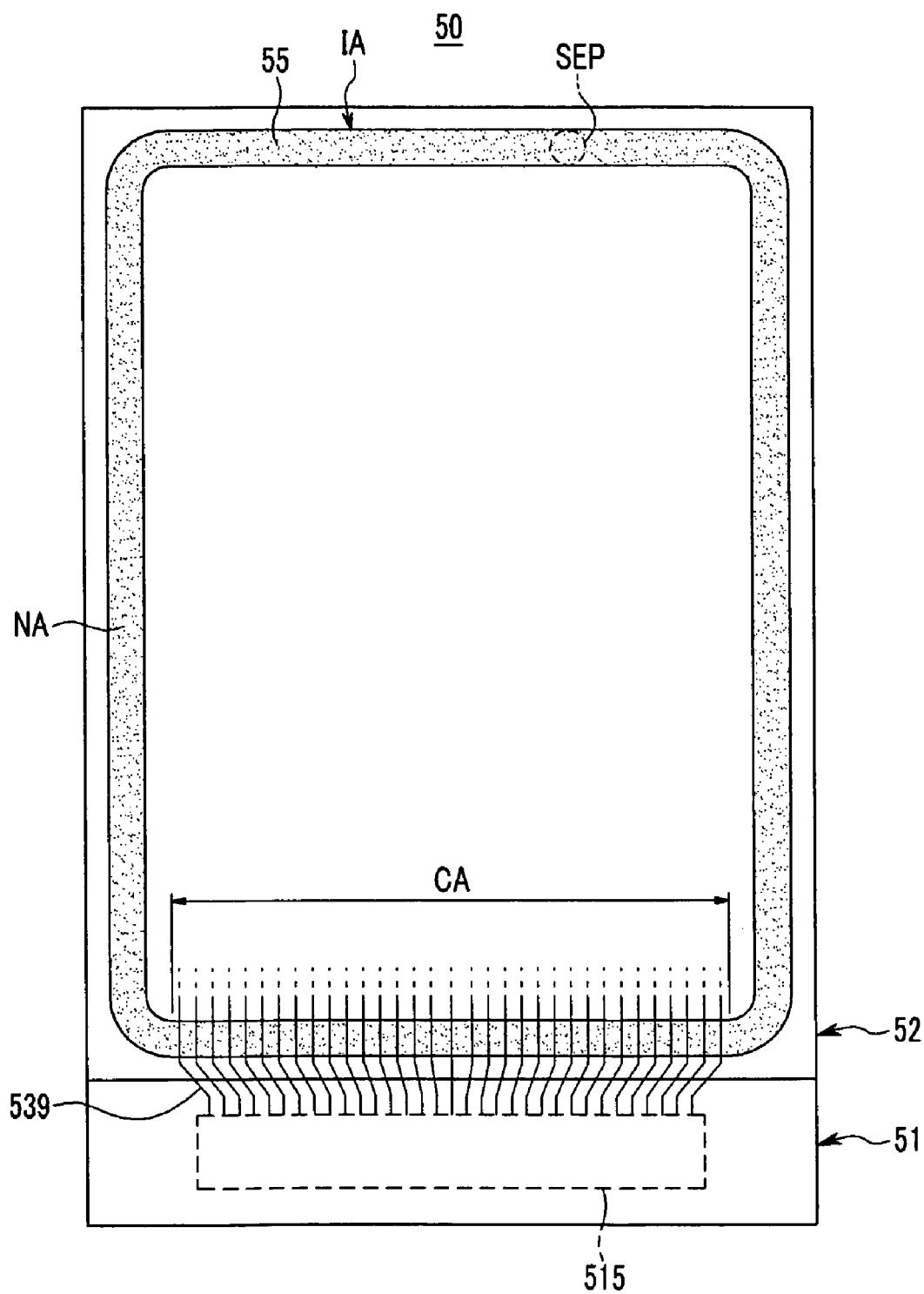
FIG. 4 illustrates a layout view of a display panel receiving light irradiated from a laser irradiation system in accordance with another exemplary embodiment.

As illustrated in FIG. 4, the target irradiation area IA in the second exemplary embodiment may be divided into a plurality of sections, e.g., high and low conductivity sections CA and NA. Referring to FIG. 4, the high conductivity section CA refers, e.g., only, to a section of the display panel 50 including wires, e.g., conductive wires 539 having relatively high conductivity, and electrically connecting a driving circuit chip 515 to the display panel 50. For example, the conductive wires 539 may be formed on one or more of the peripheries of the display panel 50, and may overlap a portion of the sealant 55. The conductive wires 539 may electrically connect devices formed in a space sealed by the driving circuit chip 515 and the sealant 55. Thus, the area in which the sealant 55 overlaps with the conductive wires 539 may be defined as the high conductivity section CA. It is noted that the low conductivity section NA refers to an area of the target irradiation area IA that excludes the high conductivity section CA. For example, as illustrated in FIG. 4, the low and high conductivity sections NA and CA may be arranged to form a closed-shaped loop having the high conductivity section CA in a bottom portion of the loop-shaped target irradiation area IA and the low conductivity section NA in a remaining portion of the target irradiation area IA.

The high conductivity section CA having the conductive wires 539 may be easily heated by the light irradiated from the laser 110, i.e., the high conductivity section CA may have a relatively higher temperature than the low conductivity section NA. Thus, the sealant 55 in the high conductivity section CA may require a lower amount of energy than in the low conductivity section NA for stable hardening. Accordingly, the laser transfer controller 140 may adjust the speed at which the laser 110 is transferred in the high conductivity section CA and low conductivity section NA of the target irradiation area IA. In particular, the laser transfer controller 140 may control the laser transfer unit 120, such that the laser 110 may be transferred at a relatively higher speed in the high conductivity section CA than in the low conductivity section NA. Further, when the laser transfer controller 140 detects that the laser transfer unit 120 is in an operating state for transferring the laser 110 along the high conductivity section CA, the laser output controller 130 may reduce the output of the laser 110 in the high conductivity section CA, as compared to the low conductivity section NA.

In contrast, when a laser of a conventional laser irradiation system irradiates under the same conditions the entire target irradiation area, i.e., both high and low conductivity sections, the high conductivity section may be overheated. As such, the sealant in the high conductivity section may be more hardened than in the low conductivity section, thereby causing a defect in the display panel.

Therefore, in accordance with the second exemplary embodiment, one or more of the output and speed of the laser 110 along the target irradiation area IA may be flexibly controlled to provide uniform hardening of the sealant 55 in the target irradiation area IA. In other words, hardening of the sealant 55 may be substantially uniform despite high heat in the high conductivity section CA. It is noted that the laser transfer controller 140 and/or the laser output controller 130 may operate to provide uniform hardening of the sealant 55, i.e., only one of or both the laser transfer controller 140 and output controller 130 may be used for speed and output adjustment.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A laser irradiation system, comprising:
   a laser configured to irradiate light;
   a laser transfer unit configured to transfer the laser along a plurality of linear and curved sections of a target irradiation area;
   a laser transfer controller configured to control the laser transfer unit to control a speed of the laser transfer in each of the plurality of linear and curved sections of the target irradiation area, the speed of the laser transfer being different in the linear section than in the curved section;
   a laser output controller configured to control an output level of the laser in each of the plurality of linear and curved sections of the target irradiation area; and
   a main controller configured to control the laser output controller and the laser transfer controller,
   wherein the laser is positioned to have a center of light irradiated from the laser closer to an outer periphery of the target irradiation area than to an inner periphery of the target irradiation in the curved section.

2. The laser irradiation system as claimed in claim 1, wherein:
   the laser transfer controller is configured to detect in real time an operating state of the laser transfer unit with respect to a type of section of the plurality of section in the target irradiation area, the type of section being linear or curved; and
   the laser output controller is configured to adjust the output level of the laser according to the operating state of the laser transfer unit.

3. The laser irradiation system as claimed in claim 1, wherein the laser transfer unit is configured to transfer the laser at a lower speed in the curved section than in the linear section.

4. The laser irradiation system as claimed in claim 3, wherein the laser output controller is configured to reduce the output level of the laser in the curved section relative to the output level in the linear section.

5. The laser irradiation system as claimed in claim 1, wherein the laser transfer unit is configured to transfer the laser along a plurality of high and low conductivity sections.

6. The laser irradiation system as claimed in claim 5, wherein the laser transfer unit is configured to transfer the laser at a higher speed in the high conductivity section than in the low conductivity section.

7. The laser irradiation system as claimed in claim 5, wherein the laser output controller is configured to reduce the output level of the laser in the high conductivity section relative to the output level of the low conductivity section.

8. The laser irradiation system as claimed in claim 1, wherein:
   the laser is configured to irradiate a closed-loop shaped target irradiation area, and
   the laser output controller is configured to gradually increase the output level of the laser to a predetermined level, as the laser starts moving away from a light irradiation start point on the closed-loop shape, and to gradually decrease the output level of the laser from the predetermined level, as the laser approaches a light irradiation end point on the closed-loop shape, and the light irradiation start and end points on the closed-loop shape are overlapping each other.

9. The laser irradiation system as claimed in claim 1, wherein the laser transfer controller is configured to modify the speed of the laser between at least two different speed values according to a type of section of the plurality of sections in the target irradiation area that is being irradiated.

10. The laser irradiation system as claimed in claim 9, wherein the laser output controller is configured to modify the output level of the laser between at least two different output values according to a type of section of the plurality of sections in the target irradiation area that is being irradiated, the type of section being linear or curved.

11. The laser irradiation system as claimed in claim 10, wherein operations of the laser transfer controller and laser output controller are performed in real time and are simultaneous with respect to predetermined sections of the target irradiation area.

12. The laser irradiation system as claimed in claim 1, wherein the laser is movable, the laser transfer unit being configured to transfer the laser at different speeds in accordance with the linear or curved sections within the target irradiation area.

13. The laser irradiation system as claimed in claim 12, wherein the laser transfer controller is configured to modify the speed of the laser when a linear section changes into a curved section within the irradiation target area or vice versa.

14. The laser irradiation system as claimed in claim 12, wherein the laser transfer unit is configured to transfer the laser faster along linear sections of the irradiation target area, as compared to curved sections of the irradiation target area.

15. The laser irradiation system as claimed in claim 14, wherein the laser output controller is configured to modify the output of the laser when a geometrical shape of a corresponding section within the irradiation target area changes.

16. The laser irradiation system as claimed in claim 1, wherein the laser output controller is configured to control the output level of the laser in each of the plurality of sections of the target irradiation area in accordance with a geometrical shape of the corresponding section within the irradiation target area.

17. The laser irradiation system as claimed in claim 1, wherein the laser transfer controller and the laser output controller are separate units configured to modify different laser properties.

18. The laser irradiation system as claimed in claim 1, wherein the laser is positioned to have a shorter outer distance than an inner distance at curved sections of the irradiation target area, the outer distance being a distance between a center of a laser beam to an outer periphery of the target irradiation area, and the inner distance being a distance between the center of the laser beam to an inner periphery of the target irradiation area.

19. The laser irradiation system as claimed in claim 1, wherein the laser transfer controller and the laser output controller are configured to control speed and output, respectively, to have a substantially same amount of energy irradiated from the laser toward each of the linear and curved sections of the target irradiation area.

20. The laser irradiation system as claimed in claim 1, wherein the laser transfer controller and the laser output controller are configured to reduce speed and output, respectively, at nonlinear sections of the target irradiation area.

\* \* \* \* \*